US011217496B2

(12) United States Patent
Chockalingam et al.

(10) Patent No.: US 11,217,496 B2
(45) Date of Patent: Jan. 4, 2022

(54) TEST PAD WITH CRACK STOP PROTECTION

(71) Applicant: GLOBALFOUNDRIES Singapore Pte. Ltd., Singapore (SG)

(72) Inventors: Ramasamy Chockalingam, Singapore (SG); Juan Boon Tan, Singapore (SG); Wanbing Yi, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/404,792

(22) Filed: May 7, 2019

(65) Prior Publication Data

US 2020/0357707 A1 Nov. 12, 2020

(51) Int. Cl.
*H01L 21/66* (2006.01)
*H01L 23/58* (2006.01)
*H01L 23/00* (2006.01)

(52) U.S. Cl.
CPC ............ *H01L 22/32* (2013.01); *H01L 23/562* (2013.01); *H01L 23/585* (2013.01)

(58) Field of Classification Search
CPC ....................................................... H01L 22/30
See application file for complete search history.

(56) References Cited

U.S. PATENT DOCUMENTS

| 5,686,762 | A | 11/1997 | Langley |
| 6,709,965 | B1 | 3/2004 | Chen et al. |
| 9,859,236 | B2 | 1/2018 | Chong et al. |
| 2004/0110365 | A1 | 6/2004 | Su et al. |
| 2005/0082577 | A1* | 4/2005 | Usui ............... H01L 24/05 257/211 |
| 2009/0102059 | A1* | 4/2009 | Ishii ............... H01L 24/05 257/774 |

* cited by examiner

*Primary Examiner* — Daniel Whalen
(74) *Attorney, Agent, or Firm* — Viering Jentschura & Partner mbB

(57) ABSTRACT

A device and methods for forming the device is provided. The device includes a substrate and circuit elements thereon. The device further includes a metallization layer over the substrate. The metallization layer includes interconnects interconnecting the circuit elements. A test pad is disposed over an uppermost interconnect in the metallization layer. The test pad is coupled to one or more circuit elements via the interconnects. The test pad is configured for testing the one or more circuit elements. A crack stop protection seal surrounding the test pad is provided. The crack stop protection seal confines damage caused by probing at the test pad from propagating to an area beyond the crack stop protection seal.

20 Claims, 15 Drawing Sheets

TEST PAD WITH CRACK STOP PROTECTION

TECHNICAL FIELD

The present disclosure relates generally to semiconductor devices, and more particularly to test pads for testing the circuitry in semiconductor devices.

BACKGROUND

As semiconductor device structures become more complex and feature sizes continue to shrink, it is important to perform testing to the device to determine defects in the device as well as debugging the functionality of the device or part of the device. To locate and identify cause of defects in a semiconductor device, various testing techniques, such as nanoprobing, may be employed. Multiple areas in the chip may be probed to identify a circuit structure that is defective. For example, a semiconductor chip is placed on a stage and multiple nanoprobes may be brought into contact with the test pad. The nanoprobes may sense electrical characteristics associated with the conductor structures such as, for example, a voltage, a current or the presence or absence of continuity. However, passivation in the chip and pad neighboring can be damaged after multiple probing. Such damage adversely affects integrity of the passivation and reliability of the chip.

From the foregoing discussion, it is desirable to provide a device having test pads that facilitates testing of circuit elements in the device, while addressing the above-mentioned problems.

SUMMARY

Embodiments generally relate to semiconductor devices and methods for forming the semiconductor devices. In some embodiments, a device which includes a substrate and circuit elements thereon is provided. The device includes a metallization layer over the substrate. The metallization layer includes interconnects interconnecting the circuit elements. A test pad is disposed over an uppermost interconnect in the metallization layer. The test pad is coupled to one or more circuit elements via the interconnects. The test pad is configured for testing the one or more circuit elements. A crack stop protection seal surrounding the test pad is provided. The crack stop protection seal confines damage caused by probing at the test pad from propagating to an area beyond the crack stop protection seal.

In some embodiments, a method for forming a device is provided. The method includes providing a substrate having circuit elements thereon. A metallization layer is arranged over the substrate. The metallization layer includes interconnects interconnecting the circuit elements. A test pad is formed over an uppermost interconnect in the metallization layer. The test pad is coupled to one or more circuit elements via the interconnects. The test pad is configured for testing the one or more circuit elements. A crack stop protection seal surrounding the test pad is formed. The crack stop protection seal confines damage caused by probing at the test pad from propagating to an area beyond the crack stop protection seal.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following.

DETAILED DESCRIPTION

Figure 1A:
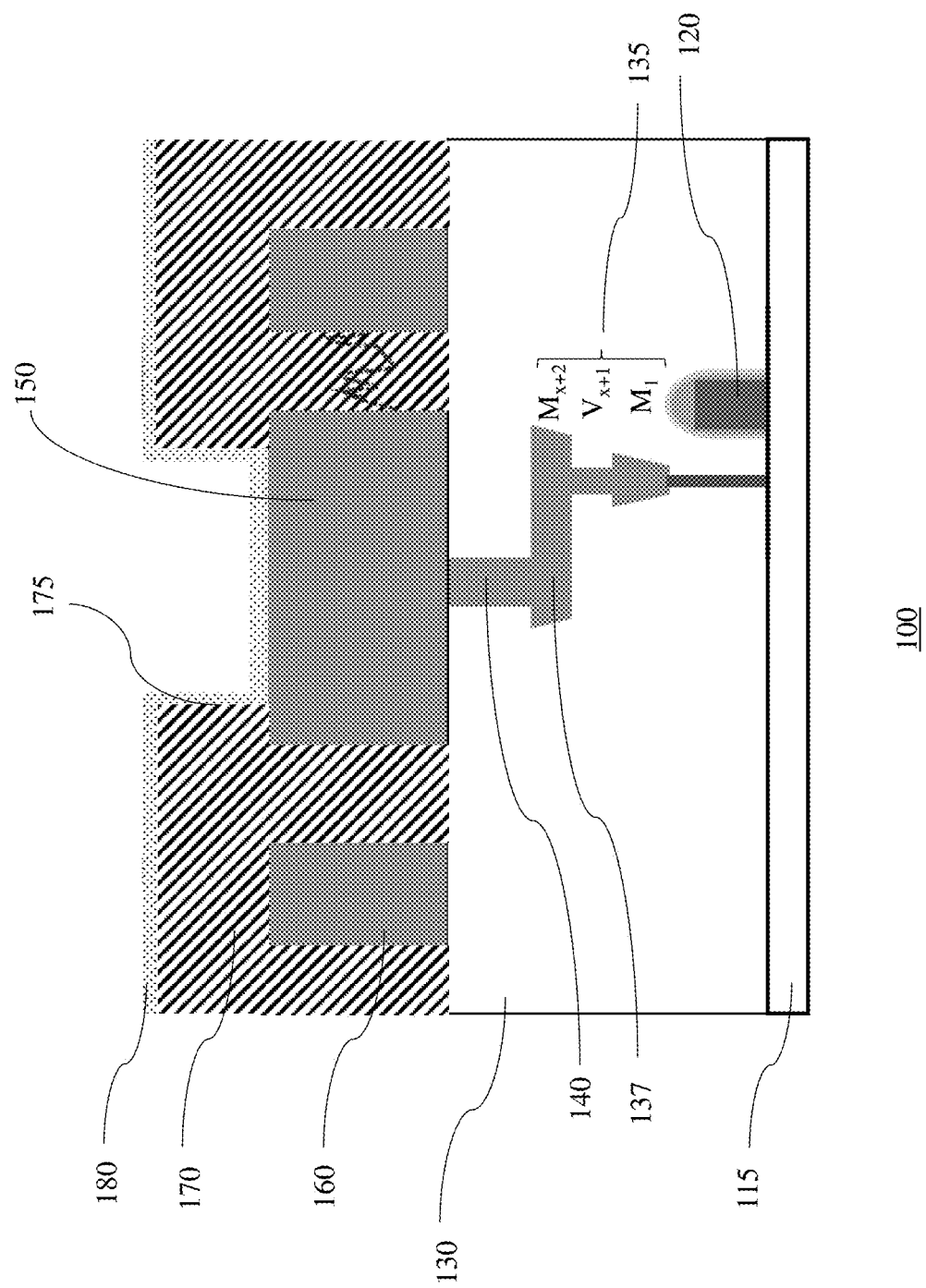
FIGS. 1A-1B show simplified cross-sectional views of embodiments of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized, and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Embodiments of the present disclosure generally relate to devices and methods for forming devices. The devices may be, for example, semiconductor devices. For example, the semiconductor devices may be integrated circuits (ICs), such as a random access memory (RAM), a programmable read only memory (PROM), a logic circuit or any type of application specific integrated circuit (ASIC) device. Embodiments of the present disclosure, as will be described, provide a crack stop protection surrounding a test pad to confine the damage caused by multiple testing/probing at the test pad. For example, the crack stop protection confines damage caused by probing at the test pad from propagating to an area beyond the crack stop protection (e.g., confines damage to be within an area around the test pad surrounded by the crack stop protection or from propagating to an area outside the crack stop protection). Devices having the crack stop protection surrounding the test pad may facilitate testing of the circuit elements (e.g., monitoring the performance of the device, signals or debugging the functionality of the device or part of the device). The devices may be incorporated into or used with, inter alia, automotive and consumer memory products.

Figure 1B:
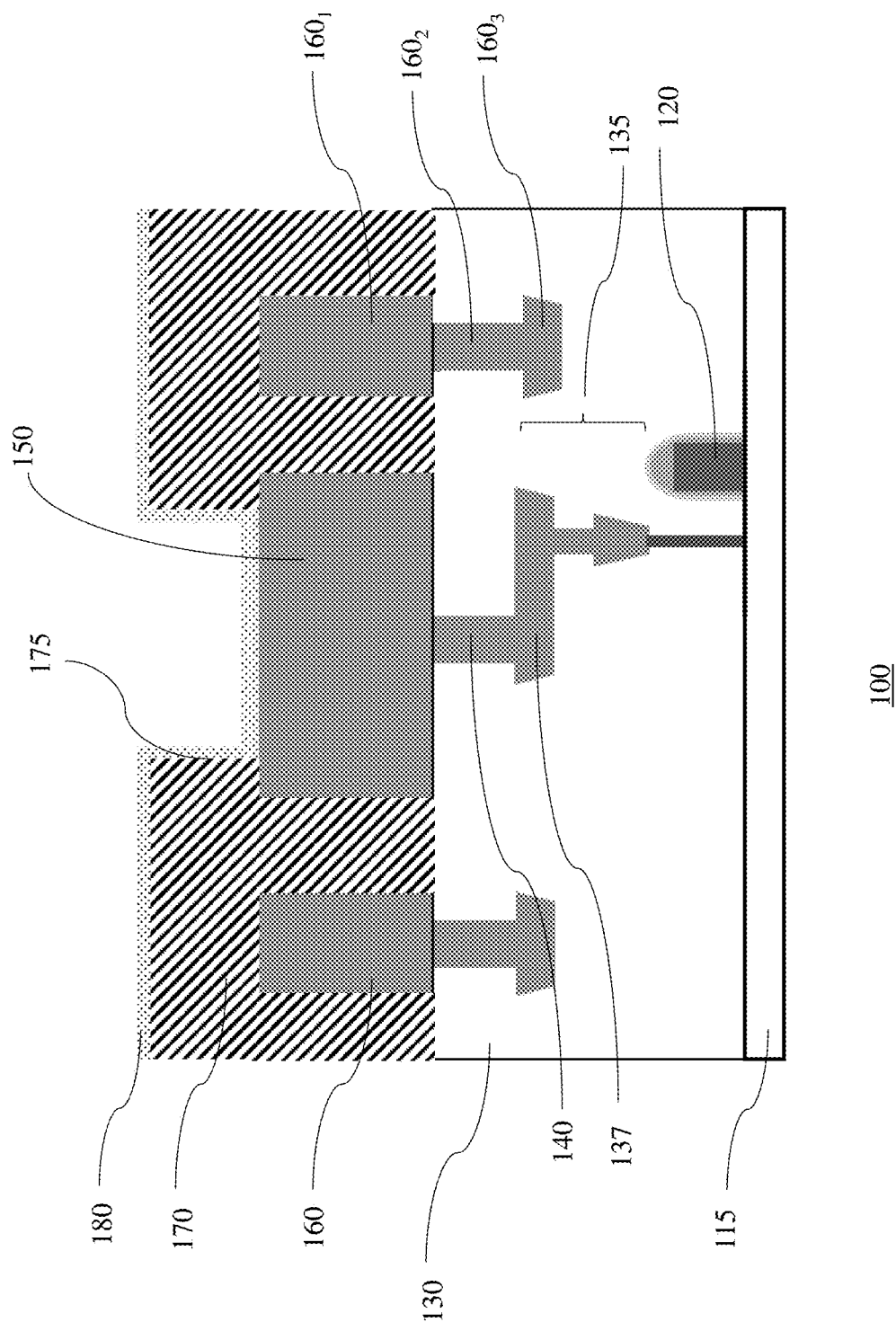
Figure 1D:
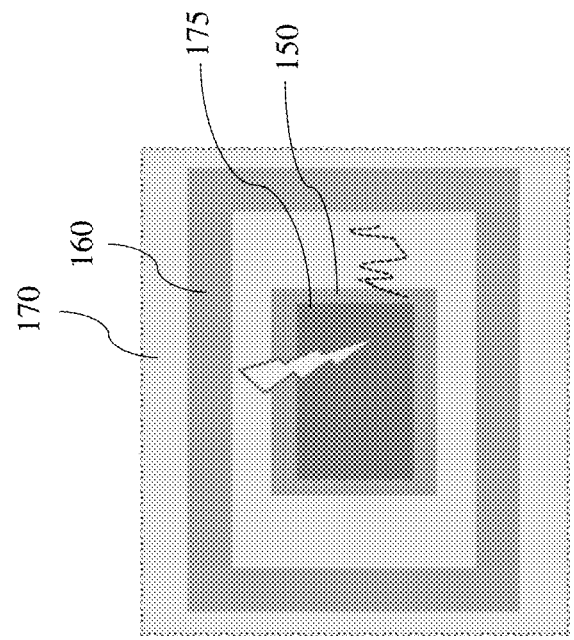
FIGS. 1C-1D show simplified top views of the device.
Figure 1C:
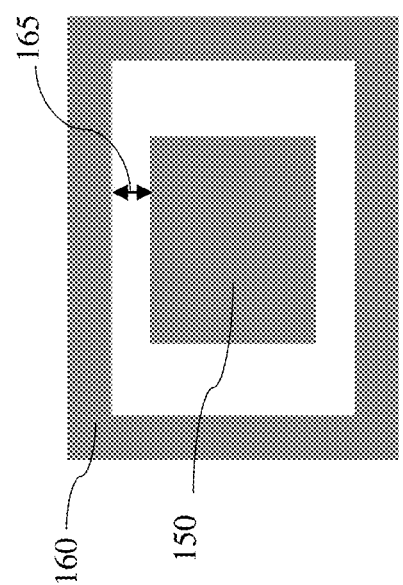

FIGS. 1A-1B show simplified cross-sectional views of embodiments of a device 100, while FIGS. 1C-1D show simplified top views of the device 100. The device 100 may be a semiconductor device (e.g., an IC chip). The device may include a substrate 115. The substrate 115 may be a semiconductor substrate, such as a silicon substrate in a non-limiting embodiment. In some embodiments, the substrate may be a crystalline-on-insulator (COI) substrate. A COI substrate may include a surface crystalline layer separated from a bulk crystalline by an insulator layer. The insulator layer, for example, may be formed of a dielectric insulating material, such as silicon oxide, which provides a buried oxide (BOX) layer. Other types of substrates may also be useful. One or more circuit elements 120 may be formed over and/or within the substrate. The circuit elements may include, for example, transistors, capacitors, resistors, diodes, or combinations thereof.

Referring to FIG. 1A, a metallization layer or interlayer dielectric (ILD) 130 may be disposed over the substrate. The metallization layer 130 may be formed by back-end-of-line (BEOL) processing. In a non-limiting example, the metallization layer 130 may be formed of one or more dielectric layers, such as low-k dielectric (e.g., SiCOH), silicon oxide, silicon nitride and etc. The dielectric layers may be formed by plasma-enhanced chemical vapor deposition (PECVD), in a non-limiting example. Other suitable material and techniques for forming the metallization layer may also be useful.

The metallization layer 130 may include interconnects 135 interconnecting the circuit elements. The interconnects 135 enable electrical connection to the circuit elements. For example, the metallization layer 130 may include a plurality of interconnect levels. Each interconnect level may include a metal level and a contact level. For example, a metal level may include metal or conductive lines, while a contact level may include via contacts. It is understood that there may be a plurality of metal lines in the same metal level. The number of interconnect levels may depend on, for example, design requirements.

The metal lines and via contacts may be formed of metals, such as copper, copper alloy, aluminum, tungsten, cobalt, ruthenium, or a combination thereof. Other suitable types of metal, alloys, or conductive materials may also be useful. The via contacts and metal lines of an interconnect level may be of the same type of conductive material or of different types of materials. For example, in upper levels of the metallization layer 130, the metal lines and via contacts may be formed by dual damascene processes. This results in the metal lines and via contacts having the same material. Where the metal lines and via contacts are formed by single damascene processes, the materials of the metal lines and via contacts may be different. As illustrated in FIG. TA, the metallization layer includes an uppermost interconnect 137. For example, the uppermost interconnect 137 may be a metal line Mm in the topmost interconnect level, where x may be 0 to 10 in a non-limiting example. The metal line $M_{x+2}$ may be disposed over a via contact $V_{x+1}$ in the topmost interconnect level.

In a non-limiting embodiment, the device 100 includes one or more via contacts 140 disposed over the uppermost interconnect 137. FIG. A illustrates a single via contact 140 in a non-limiting embodiment. In other embodiments, the one or more via contacts 140 may be multiple via contacts. In a non-limiting example, the one or more via contacts 140 may include about 1 to 5 via contacts. Providing multiple via contacts 140 enables lower series resistance. In yet other embodiments, the one or more via contacts 140 may be an array of via contacts disposed over the uppermost interconnect 137. The one or more via contacts 140 contact the test pad 150 and the uppermost interconnect 137. The one or more via contacts 140 couple the test pad 150 to the interconnects 135 in the metallization layer 130. The one or more via contacts 140 may be formed of metals, such as copper, copper alloy, aluminum, tungsten, cobalt, ruthenium, or a combination thereof. Other suitable types of metal, alloys, or conductive materials may also be useful. In a non-limiting embodiment, the one or more via contacts 140 may each have a small dimension. For example, each of the one or more via contacts 140 may have a width ranging from about 0.5 um to about 1.5 um.

In a non-limiting embodiment, the device 100 includes a test pad 150 disposed over the uppermost interconnect 137 in the metallization layer 130. The test pad 150 may be coupled to the one or more circuit elements 120 via the interconnects 135 and the one or more via contacts 140. The test pad may be electrically connected to part of the circuitry in the device 100 for testing the one or more circuit elements (e.g., monitoring the performance of the device, signals or debugging the functionality of the device or part of the device). In a non-limiting embodiment, the test pad 150 may be disposed over the one or more via contacts 140, providing a pad-on-via configuration. Providing the test pad 150 over the one or more via contacts 140 with each of the via contacts, having a relatively smaller dimension, enables the test pad 150 to have a substantially flat profile (e.g., flat top and bottom surfaces). For example, providing a substantially flat test pad 150 facilitates good contact by a probe needle. During testing from location to location or die to die, the probe needle may crash on an uneven test pad. The test pad 150 having a substantially flat profile as described advantageously facilitates nanoprobing and prevents or reduces impact and/or damage which may be caused by probe needles. The test pad 150 may be formed by physical vapor deposition (PVD) in a non-limiting embodiment. The flat pad surface may be achieved without impact to the dimension of the test pad. The one or more via contacts 140 couple the test pad 150 to the interconnects 135 in the metallization layer 130.

In a non-limiting embodiment, the test pad 150 may have a dimension ranging from about 0.1 um×0.1 um to 10 um×10 um. For example, the test pad 150 may have a width ranging from about 0.1 um to about 10 um, and a length ranging from about 0.1 um to about 10 um. Alternatively, the test pad 150 may have a dimension of about 2 um×2 um. In a non-limiting embodiment, the test pad 150 may have a thickness ranging from about 0.05 um to about 5 um.

In a non-limiting embodiment, a ratio of the width of a via contact 140 below the test pad to the width of the test pad 150 may range from about 1:10 to about 1:10000.

In a non-limiting embodiment, the device 100 includes a crack stop protection seal 160 surrounding the test pad 150. The crack stop protection seal 160 surrounding the test pad 150 may be provided for devices that are to be probed for testing the circuitry of the device. The crack stop protection seal 160 confines damage caused by multiple probing/testing at the test pad from propagating to an area beyond the crack stop protection seal. In other words, the crack stop protection seal 160 confines damage caused by multiple probing/testing to be within an area around the test pad 150 surrounded by the crack stop protection seal. The crack stop protection seal 160 may be formed in a passivation layer 170. The crack stop protection seal 160 may be spaced apart from the test pad 150 by dielectric material in the passivation layer. In a non-limiting example, the crack stop protection seal 160 may be spaced apart from the test pad 150 by about 0.05 um to about 5 um.

In a non-limiting embodiment, the crack stop protection seal 160 may be formed of the same material as the test pad 150. In a non-limiting embodiment, the crack stop protection seal 160 and the test pad 150 may be formed of metal, such as copper (Cu). Other types of metal or conductive material may also be useful depending on the material required for the test pad. In other embodiments, the crack stop protection seal 160 and the test pad 150 may be formed of different metals. In yet other embodiments, the crack stop protection seal 160 may be formed of a rigid material. For example, the rigid material may resist deformation when force is being applied to it. Other configurations or materials for the crack stop protection seal may also be useful.

The crack stop protection seal 160 may have a depth and a width that confines damage caused by multiple probing/testing at the test pad within an area surrounded by the crack stop protection seal. In a non-limiting example, the width of the crack stop protection seal may range from about 50 nm to about 5000 nm. Other widths may also be useful.

In a non-limiting embodiment, the crack stop protection seal 160 may be formed simultaneously with the test pad 150 (i.e., formed in the same step). For example, a metal layer may be deposited over the metallization layer by physical vapor deposition (PVD) to form the test pad 150 and the crack stop protection seal 160 in the same step. The metal layer may then be patterned by mask and etch techniques, forming the test pad 150 and the crack stop protection seal 160. The crack stop protection seal 160 may have a same depth (or height) as the test pad 150, as illustrated in FIG. 1A. For example, the crack stop protection seal 160 and the test pad may have depths ranging from about 0.05 um to about 5 um. Other depths for the crack stop protection seal and the test pad may also be useful. Forming the test pad 150 and the crack stop protection seal 160 in separate steps may also be useful. For example, in the case the crack stop protection seal is formed of a different material than the test pad, separate processes may be used to form the test pad and the crack stop protection seal. The crack stop protection seal 160 and the test pad 150 may have a substantially planar top surface.

In other embodiments, the crack stop protection seal 160 may have a depth which extends through the metallization layer 130 from a top surface of the test pad. As illustrated in FIG. 1B, the crack stop protection seal 160 further extends from a top surface of the metallization layer 130 and at least into a portion of the metallization layer 130. In this case, the crack stop protection seal 160 may include one or more portions in the metallization layer which may be formed by multiple deposition and patterning steps.

In a non-limiting embodiment, the crack stop protection seal 160 includes a first portion $160_1$ and a second portion $160_2$. The first portion $160_1$ may be formed in the same step as the test pad 150, while the second portion $160_2$ may be formed in the same step as the one or more via contacts 140. For example, the first portion $160_1$ may be formed of the same material and have the same depth as the test pad 150 in the passivation layer, while the second portion $160_2$ may be formed of the same material and have the same depth as the one or more via contacts 140 below the test pad 150 in the metallization layer. The widths of the first portion $160_1$ and the second portion $160_2$ may be different or the same. For example, the second portion $160_2$ of the crack stop protection seal 160 may have the same width as the one or more via contacts 140. In another non-limiting embodiment, the crack stop protection seal may further include a third portion $160_3$. The third portion $160_3$ may be a metal line in the case the uppermost interconnect 137 is a metal line. The third portion $160_3$ may be formed in the same step as the uppermost interconnect 137. For example, the third portion $160_3$ may be formed of the same material and have the same depth as the uppermost interconnect 137 over which the test pad 150 is disposed. In alternative embodiments, the crack stop protection seal 160 may be provided with other depths in the metallization layer such as, for example, extending to a bottom of the metallization layer 130. In such case, other portions of the crack stop protection seal 160 may be formed in the same steps as the interconnects for each corresponding interconnect level. Other configurations for the crack stop protection seal 160 may also be useful. In other embodiments, the crack stop protection seal 160 may be provided without one or more portions below the first portion $160_1$. For example, the crack stop protection seal 160 may be provided without extending into the metallization layer 130.

FIG. 1C shows a top view of the crack stop protection seal 160 surrounding the test pad 150. The crack stop protection seal 160 may be disposed around the test pad 150. Referring to FIG. 1C, the crack stop protection seal 160 may have a ring structure. The ring structure, for example, is a continuous ring structure. As illustrated, the ring is rectangular. Providing the crack stop protection seal 160 having other ring shapes, such as a circular ring, may also be useful. Other suitable patterns may also be useful. As described, the crack stop protection seal 160 may be spaced apart 165 from the test pad 150.

Referring back to FIGS. 1A-1B, the passivation layer 170 may be disposed over the test pad 150 and the crack stop protection seal 160. As illustrated, the passivation layer 170 completely covers a top surface of the crack stop protection seal 160. The passivation layer 170 fills a gap/spacing between the test pad 150 and the crack stop protection seal 160.

FIG. 1D shows a top view of the passivation layer 170 disposed over the test pad 150 and the crack stop protection seal 160. The passivation layer 170 may include a probe opening 175 which exposes a portion of the test pad 150. The crack stop protection seal 160 confines damage caused by probing at the test pad from propagating to the passivation layer 170 beyond the crack stop protection seal 160. Referring back to FIGS. 1A-1B, the probe opening 175 at least partially exposes a top surface of the test pad. The probe opening 175 may have a smaller dimension or the same dimension as the test pad 150. In a non-limiting example, the probe opening 175 may have a dimension of about 2 um×2 um or less. In a non-limiting example, testing, such as by nanoprobing, may be performed at the test pad 150 through the probe opening 175, inter alia, for monitoring the circuit elements, measuring the circuit elements or debugging.

In some embodiments, a capping layer 180 may be disposed over the passivation layer 170. In a non-limiting embodiment, the capping layer 180 may be a nitrogen-doped silicon carbide layer. In a non-limiting example, the nitrogen-doped silicon carbide layer may be an NBlok layer. In other embodiments, the capping layer 180 may be formed of silicon nitride (SiN) or silicon dioxide ($SiO_2$) materials. The capping layer 180 lines the probe opening 175 and the top surface of the test pad 150.

In alternative embodiments, the device 100 may include n crack stop protection seals surrounding the test pad 150, where n is a whole number ≥1. For example, the test pad 150 as described in FIGS. 1A-1D is illustrated with a single crack stop protection seal (n=1) surrounding the test pad 150. Providing a plurality of crack stop protection seals surrounding the test pad 150 may also be useful.

Figure 1E:
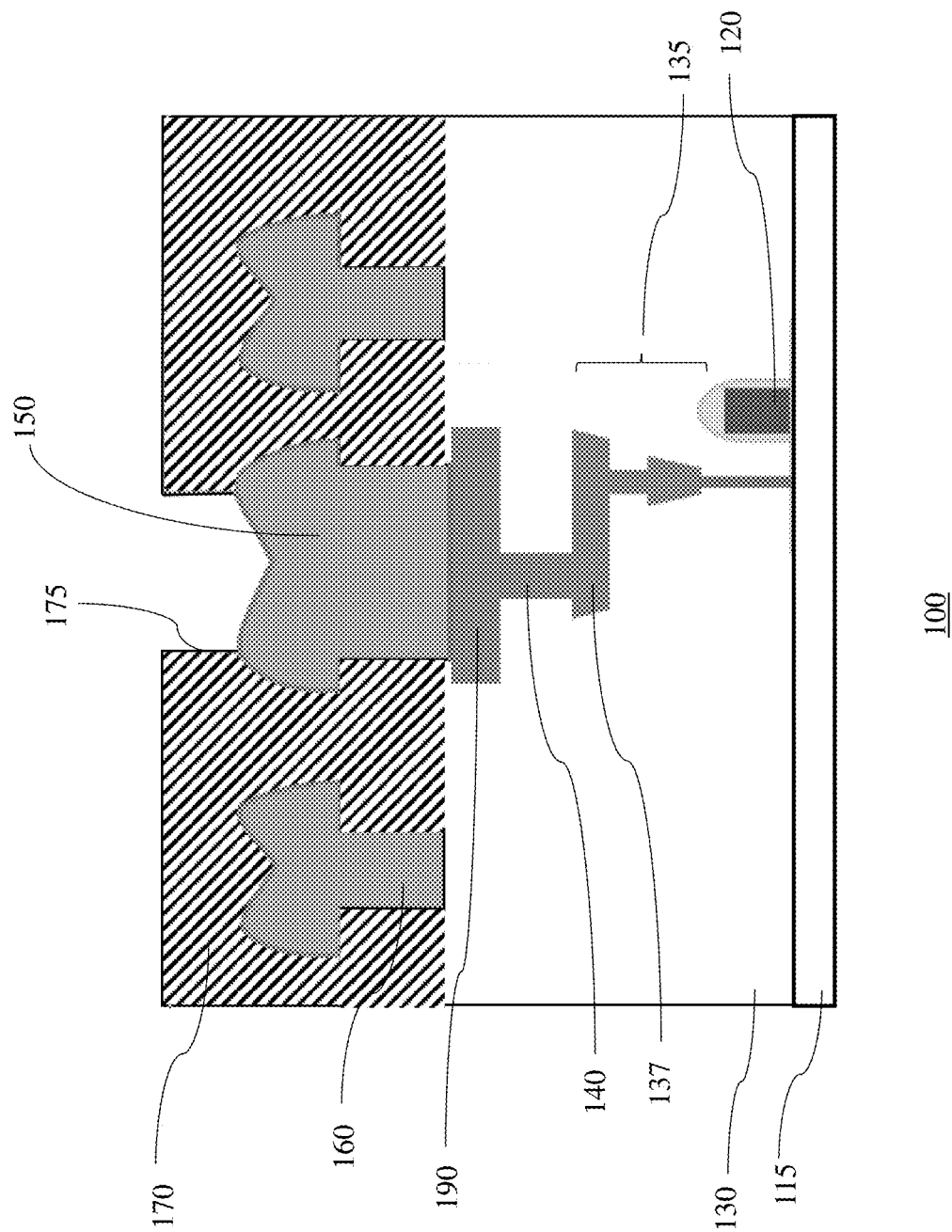
FIGS. 1E-1F show simplified cross-sectional views of yet other embodiments of the device.

FIG. 1E shows a simplified cross-sectional view of yet another embodiment of the device 100. The device, for example, is similar as that shown and described in FIGS. 1A-1D. Common elements may not be described or described in detail.

In a non-limiting embodiment, a metal line 190 may be disposed over the one or more via contacts 140. The metal line 190 covers a top surface of the one or more via contacts 140. The metal line 190 may be formed of metal, such as copper, aluminum, tungsten, cobalt, ruthenium, alloys thereof, or a combination thereof. The metal line 190 may have a dimension ranging from about 4000 nm to about 10000 nm. The metal line 190 may have a substantially flat profile. For example, the metal line 190 may have substantially flat top and bottom surfaces.

The test pad 150 may be disposed over the metal line 190. The metal line 190 and the one or more via contacts 140 couple the test pad 150 to the uppermost interconnect 137.

Similar to the embodiments described in FIGS. 1A-1D, the crack stop protection seal 160 surrounds the test pad 150. The crack stop protection seal 160 may be formed in the same step as the test pad 150 and may have a same depth as the test pad 150, as illustrated in FIG. 1E. The test pad 150 and the crack stop protection seal 160 may be formed of the same material. The crack stop protection seal 160 and the test pad 150 may be formed of metal, such as aluminum. Other material for forming the test pad 150 and the crack stop protection seal 160 may also be useful.

Figure 1F:
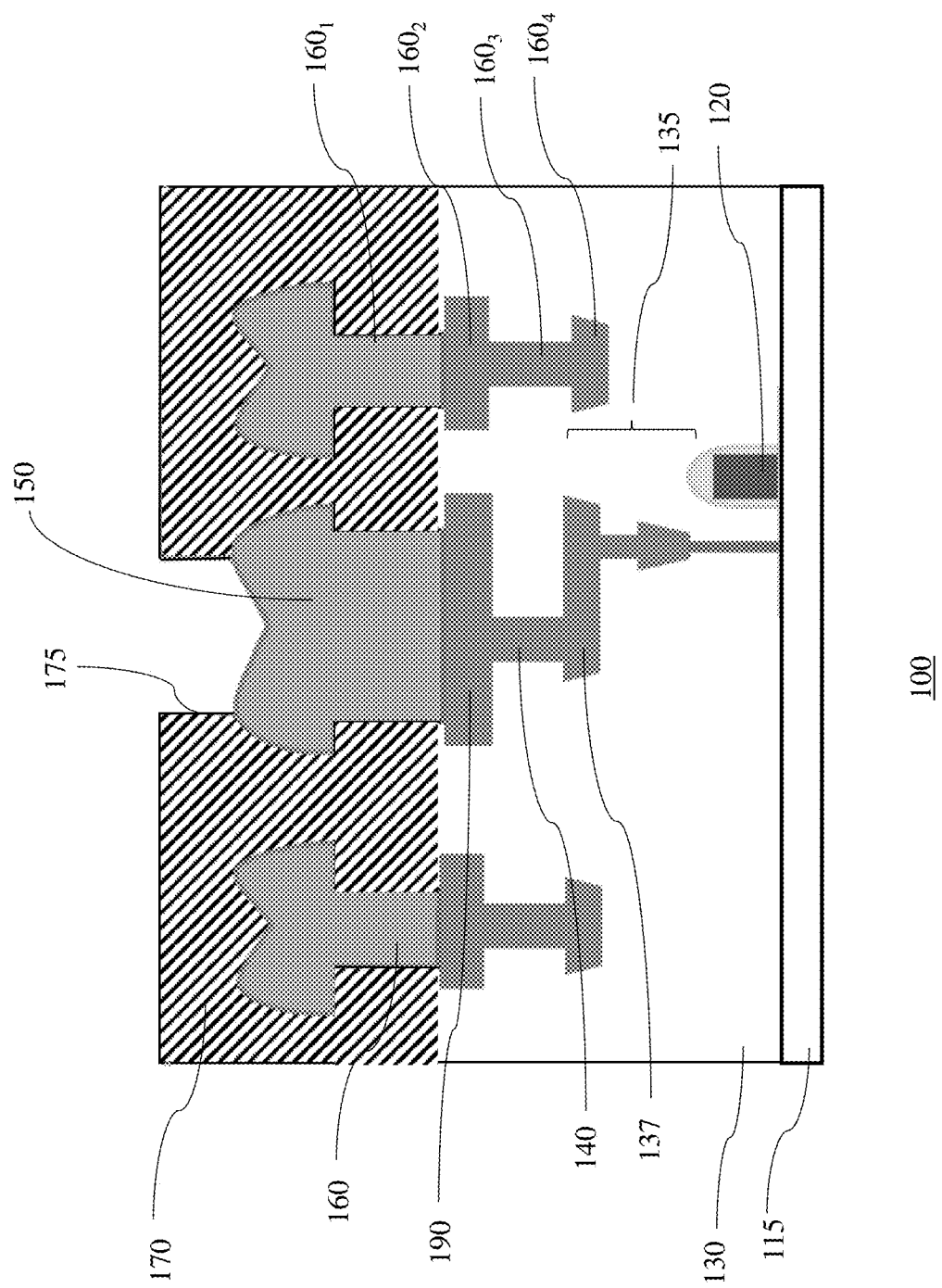

In other non-limiting embodiments, the crack stop protection seal 160 may have a depth which extends through the metallization layer 130. As illustrated in FIG. 1F, the crack stop protection seal 160 further extends from above a top surface of the metallization layer 130 and at least into a portion of the metallization layer. Similar to the embodiment as described in FIG. 1B, the crack stop protection seal 160 may include one or more portions in the metallization layer 130 formed by multiple deposition and patterning steps.

In a non-limiting embodiment, the crack stop protection seal includes a first portion 160 and a second portion $160_2$. For example, the first portion $160_1$ may be formed of the same material and have the same depth as the test pad 150, while the second portion $160_2$ may be formed of the same material and have the same depth as the metal line 190 below the test pad 150. The first portion $160_1$ may be formed in the same step as the test pad 150, while the second portion $160_2$ may be formed in the same step as the metal line 190.

In another non-limiting embodiment, the crack stop protection seal may further include a third portion $160_3$ formed of the same material and having the same depth as the one or more via contacts 140 over which the metal line 190 is disposed. The third portion $160_3$ may be formed in the same step as the one or more via contacts 140. In yet another non-limiting embodiment, the crack stop protection seal 160 may further include a fourth portion $160_4$ formed of the same material and having the same depth as the uppermost interconnect 137 over which the test pad 150 is disposed. The fourth portion $160_4$ may be formed in the same step as the uppermost interconnect 137. In alternative non-limiting embodiments, the crack stop protection seal 160 may be provided with other depths in the metallization such as, for example, extending to a bottom of the metallization layer 130. In such case, other portions of the crack stop protection seal 160 may be formed in the same steps as the interconnects 137 over which the test pad is disposed.

Figure 2:
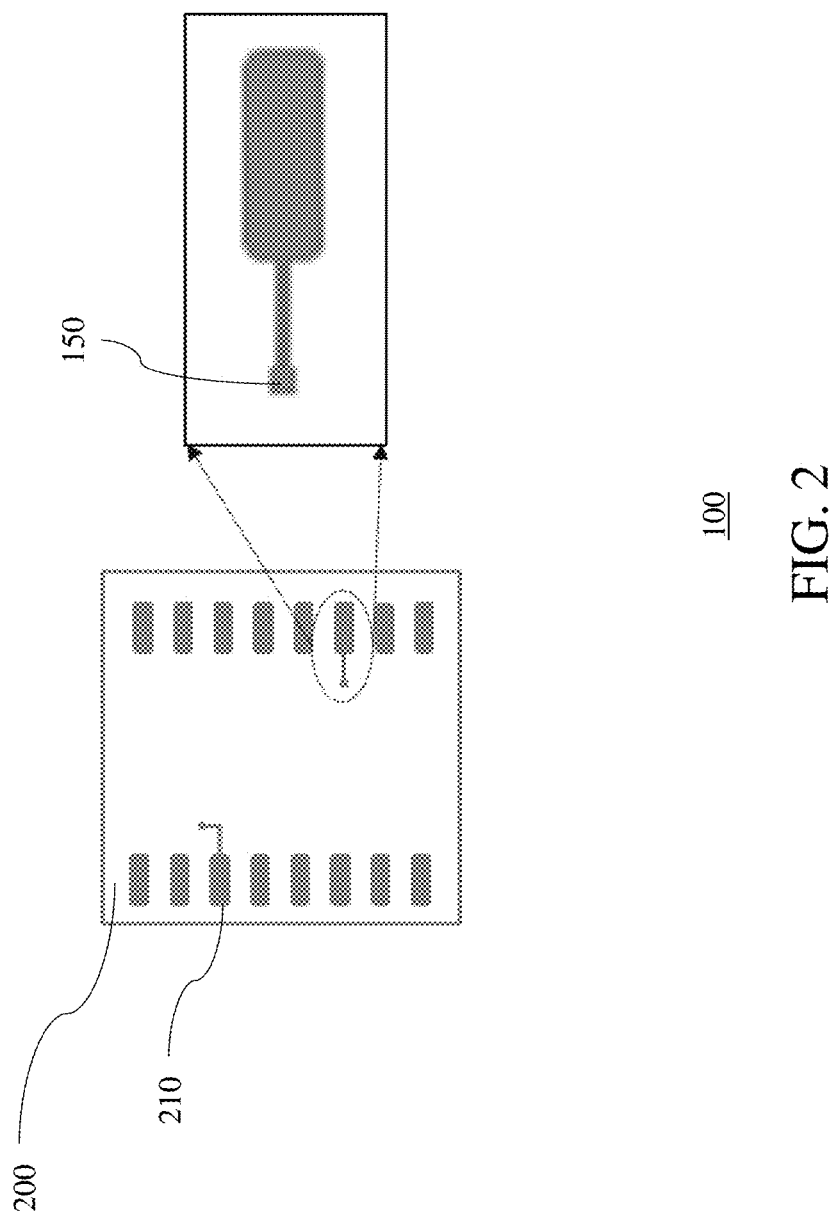
FIG. 2 shows another simplified top view of the device.

FIG. 2 shows another simplified top view of an embodiment of the device 100. The device 100 may be a chip 200. The chip 200 includes circuit elements and a plurality of bond pads 210 disposed over the circuit elements. The bond pads 210 enable external connections to the circuit elements. For example, wire bonds or conductive bumps may be bonded to the bond pads 210 to facilitate electrical connection to external components, such as a semiconductor module or package. The chip 200 includes one or more test pads 150. A test pad may be surrounded by a crack stop protection seal, as described, to facilitate testing, such as by nanoprobing, of one or more of the circuit elements in the chip while confining damage caused by probing at the test pad from propagating to an area beyond the crack stop protection seal. For example, one or more of the bond pads 210 in the chip 200 may be coupled to a test pad 150. A pad-on-via configuration may be implemented for the high density test pads to minimize area consumption.

In a non-limiting embodiment, a dimension of a test pad 150 to a bond pad 210 may have a ratio ranging from about 1:10 to about 1:1000.

Figure 3A:
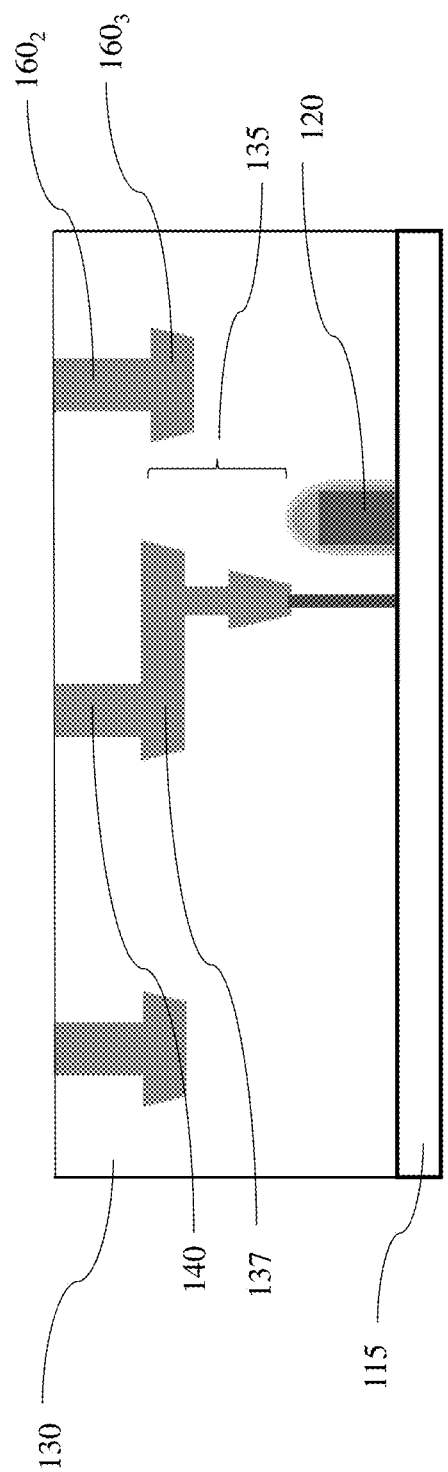
FIGS. 3A-3C show simplified cross-sectional views of a process for forming a device.
Figure 3B:
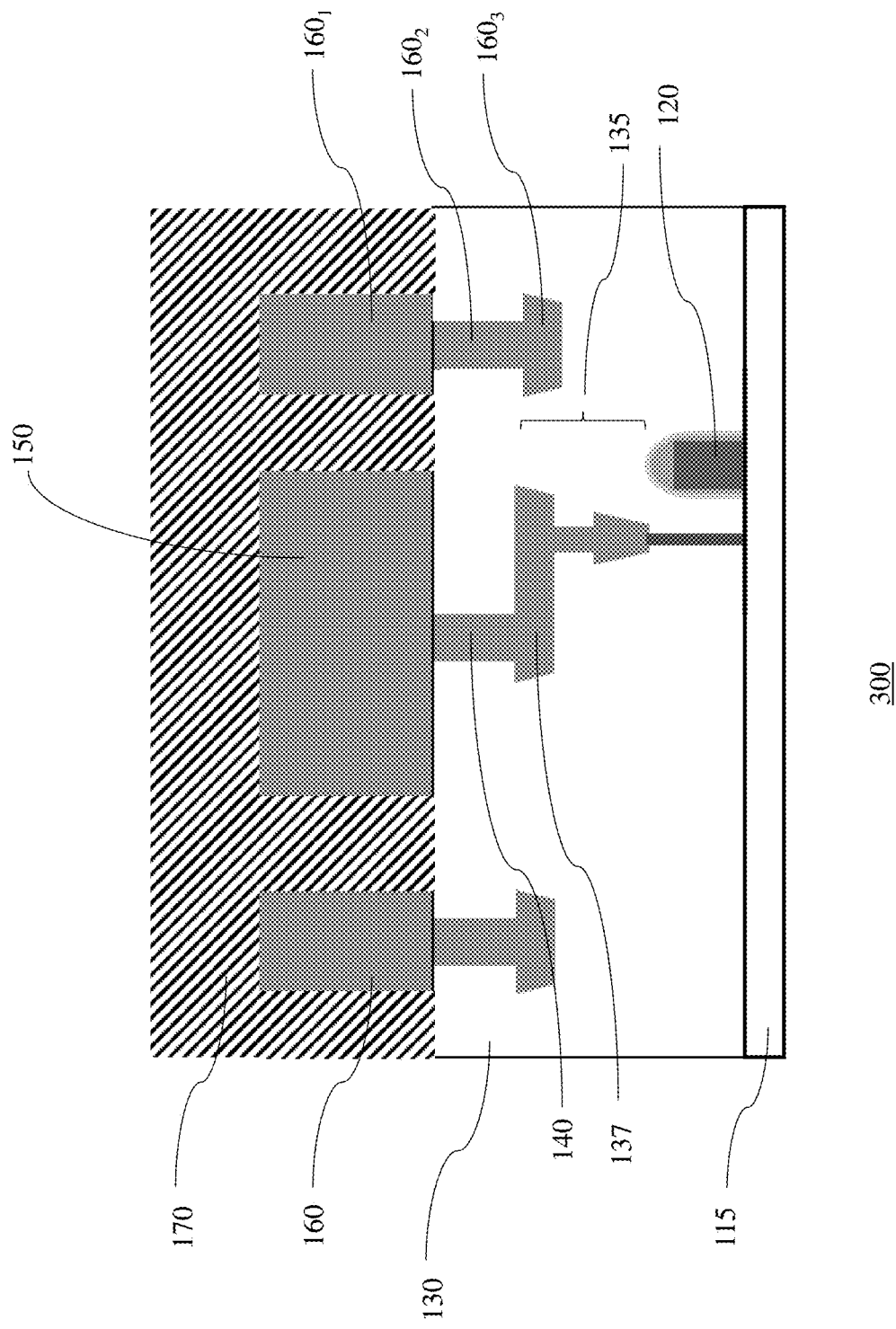
Figure 3C:
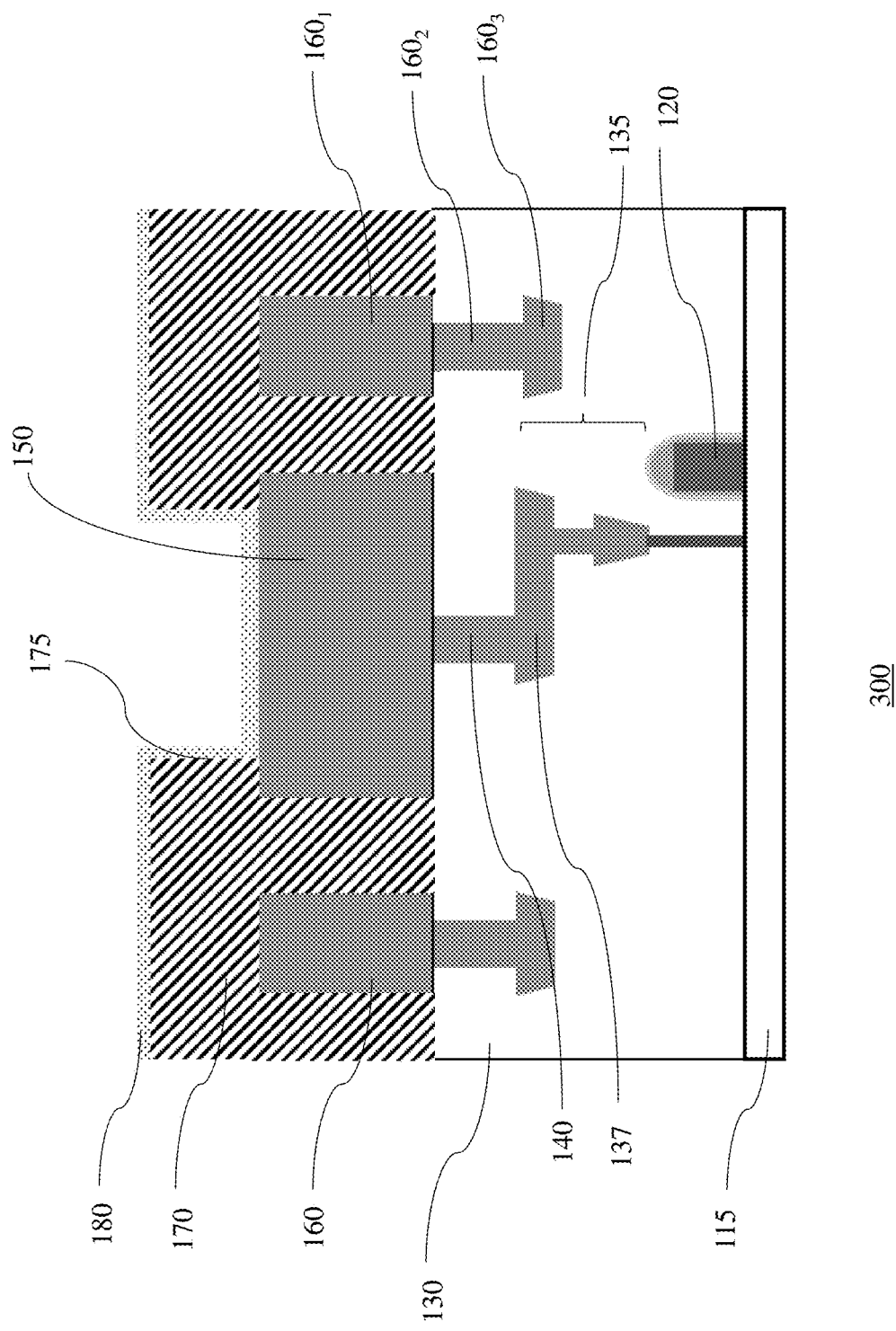

FIGS. 3A-3C show simplified cross-sectional views of a process 300 for forming a device. The device formed, for example, is similar or the same as that shown and described in FIGS. 1A-1D and FIG. 2. Common elements may not be described or described in detail. As illustrated in FIG. 3A, a substrate 115 may be provided. The substrate may be a semiconductor substrate, such as a silicon substrate in a non-limiting embodiment. Other types of substrates may also be useful. For simplicity of discussion and in the interest of brevity, the processing of a substrate to form one or more circuit elements 120, such as transistors, are not described.

A metallization layer 130 may be arranged over the substrate. The metallization layer may be formed by BEOL processing. The metallization layer may be formed of one or more dielectric layers. In a non-limiting example, the dielectric layers may be formed by deposition such as plasma-enhanced chemical vapor deposition (PECVD). Other suitable material and techniques for forming the metallization layer may also be useful.

The metallization layer 130 may include interconnects 135 interconnecting the circuit elements 120. The interconnects 135 may be metal lines and via contacts formed in a plurality of interconnect levels. For example, the metallization layer 130 may be patterned to form via openings and trenches by mask and etch techniques. For example, a via opening and a trench may be formed in an interconnect level for forming a via contact and a metal line. Metal may be deposited over the metallization layer, and a planarization process may be performed to form interconnects 135 in the metallization layer. In a non-limiting example, the metal may be copper, aluminum, tungsten, cobalt, ruthenium, alloys thereof, or a combination thereof. Other suitable metals may also be employed. The process, for example, may continue to form additional dielectric layers (e.g., additional interconnect levels) and interconnects for the metallization layer. An uppermost interconnect 137 in the metallization layer may be exposed.

In a non-limiting embodiment, one or more via contacts 140 may be formed over the uppermost interconnect 137. The one or more via contacts 140 couple a subsequently formed test pad to the uppermost interconnect 137. For example, a dielectric layer may be deposited over the uppermost interconnect 137, and one or more via openings corresponding to the one or more via contacts may be formed over the uppermost interconnect in the dielectric layer. A metal layer be deposited over the dielectric layer to fill the one or more via openings. In a non-limiting example, the metal layer may be copper, aluminum, tungsten, cobalt, ruthenium, alloys thereof, or a combination thereof. Other suitable metals may also be useful. A planarization process may be performed to remove the excess metal layer, forming the one or more via contacts 140.

In some embodiments where a crack stop protection seal to be formed includes one or more portions in the metallization layer 130, the one or more portions of the crack stop protection seal in the metallization layer 130 may be formed in the same step as forming the one or more via contacts 140 and/or one or more metal lines and/or via contacts of the interconnects 135. For example, a first portion of the crack stop protection seal may be formed in the same step as the subsequently formed test pad as will be described below, while a second portion $160_2$ and a third portion $160_3$ of the crack stop protection seal may be formed in the same step as forming the one or more via contacts 140 and uppermost interconnect 137. In other embodiments, the crack stop protection seal may be formed without one or more portions in the metallization layer 130.

In a non-limiting embodiment, a test pad 150 may be formed over the uppermost interconnect 137 in the metallization layer. In a non-limiting embodiment, the test pad 150 may be formed on the one or more via contacts 140 over the interconnects 135. The test pad may be coupled to one or more circuit elements via the interconnects 135 and the one or more via contacts 140. The test pad 150 is configured for testing the one or more circuit elements 120.

In a non-limiting embodiment, the crack stop protection seal 160 which surrounds the test pad may be formed. For example, in the case the crack stop protection seal 160 includes one or more portions in the metallization layer 130, a portion of the crack stop protection seal 160 surrounding the test pad 150 above the metallization layer 130 may be referred to as the first portion $160_1$. The crack stop protection seal confines damage caused by probing at the test pad from propagating to an area beyond the crack stop protection seal 160.

In a non-limiting embodiment, the test pad 150 and the crack stop protection seal 160 (or first portion $160_1$ of the crack stop protection seal) may be formed simultaneously over the metallization layer (e.g., in the same step). For example, a metal layer may be deposited by PVD and patterned by mask and etch techniques, forming the test pad 150 and the crack stop protection seal 160 surrounding the test pad 150, as illustrated in FIG. 3B. In a non-limiting example, the metal layer may be copper. Other suitable types of conductive materials may also be useful. Other suitable techniques for forming the test pad and the crack stop protection seal may also be useful.

In some cases, the test pad and the crack stop protection seal may be formed simultaneously with a plurality of bond pads in the device.

In a non-limiting embodiment, a passivation layer 170 may be formed over the test pad and the crack stop protection seal. The passivation layer may be deposited, for example, by chemical vapor deposition (CVD). The passivation layer 170 fills a gap/space between the test pad 150 and the crack stop protection seal 160 (or first portion $160_1$ of the crack stop protection seal) and encompasses the test pad and the crack stop protection seal. The passivation layer 170 may be formed of a dielectric material such as silicon nitride (SiN) in a non-limiting example. Other materials suitable for passivation may also be useful.

In a non-limiting embodiment, a probe opening 175 may be formed in the passivation layer 170 to at least partially expose a top surface of the test pad 150. The probe opening may be formed by mask and etch techniques. In some embodiments, a capping layer 180 may be deposited over the passivation layer. The capping layer 180 lines the probe opening 175 and the top surface of the test pad 150. The capping layer 180 may be formed by CVD, in a non-limiting example. The capping layer 180 for example, may be a nitrogen-doped silicon carbide layer. Other suitable types of capping layer may also be useful.

FIGS. 4A-4F show simplified cross-sectional views of another exemplary process for forming a device. The device formed, for example, is similar or the same as that shown and described in FIGS. 1C-1F and FIG. 2. Common elements may not be described or described in detail.

Figure 4A:
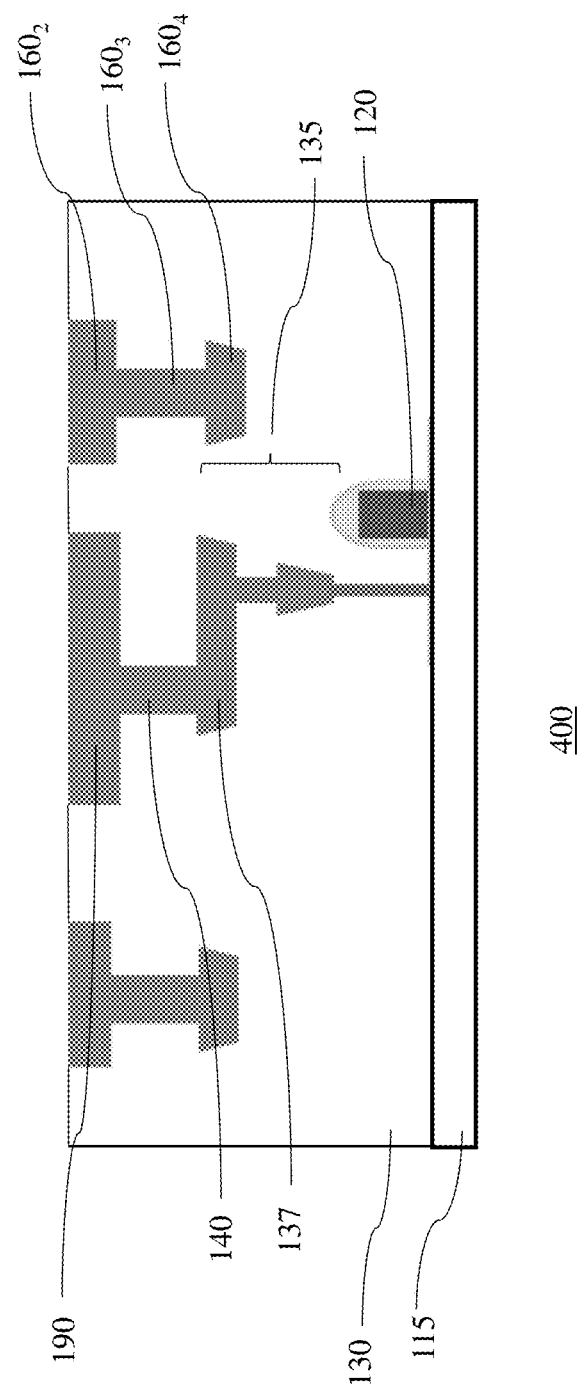
FIGS. 4A-4F show simplified cross-sectional views of another exemplary process for forming a device.

As shown in FIG. 4A, a substrate 115 may be provided. The substrate may be similar to that described with respect to FIG. 3A. For example, the substrate 115 may include one or more circuit elements 120 and a metallization layer 130 arranged over the substrate. Similarly, the metallization layer 130 may include interconnects 135 interconnecting the circuit elements 120. The interconnects 135 include an uppermost interconnect 137 in the metallization layer 130. One or more via contacts 140 may be formed over the uppermost interconnect 137. The one or more via contacts couple a subsequently formed test pad to the uppermost interconnect 137.

In a non-limiting embodiment, a metal line 190 may be formed over the one or more via contacts 140. The metal line 190 covers a top surface of the one or more via contacts 140. The metal line 190 may be formed of metal, such as copper, aluminum, tungsten, cobalt, ruthenium, alloys thereof, or a combination thereof. The metal line 190 may have a substantially flat profile. For example, the metal line 190 may have substantially flat top and bottom surfaces.

In some embodiments where a crack stop protection seal to be formed includes one or more portions in the metallization layer 130, the one or more portions of the crack stop protection seal in the metallization layer 130 may be formed in the same step as forming the metal line 190, the one or more via contacts 140 and/or one or more metal lines and/or via contacts of the interconnects 135. For example, a first portion of the crack stop protection seal may be formed in the same step as the subsequently formed test pad as will be described below, while a second portion $160_2$, a third portion $160_3$ and a fourth portion $160_4$ of the crack stop protection seal may be formed in the same step as forming the metal line 190, the one or more via contacts 140 and the uppermost interconnect 137. Other portions or depths of the crack stop protection seal may also be useful. In other embodiments, the crack stop protection seal may be formed without one or more portions in the metallization layer 130.

Figure 4B:
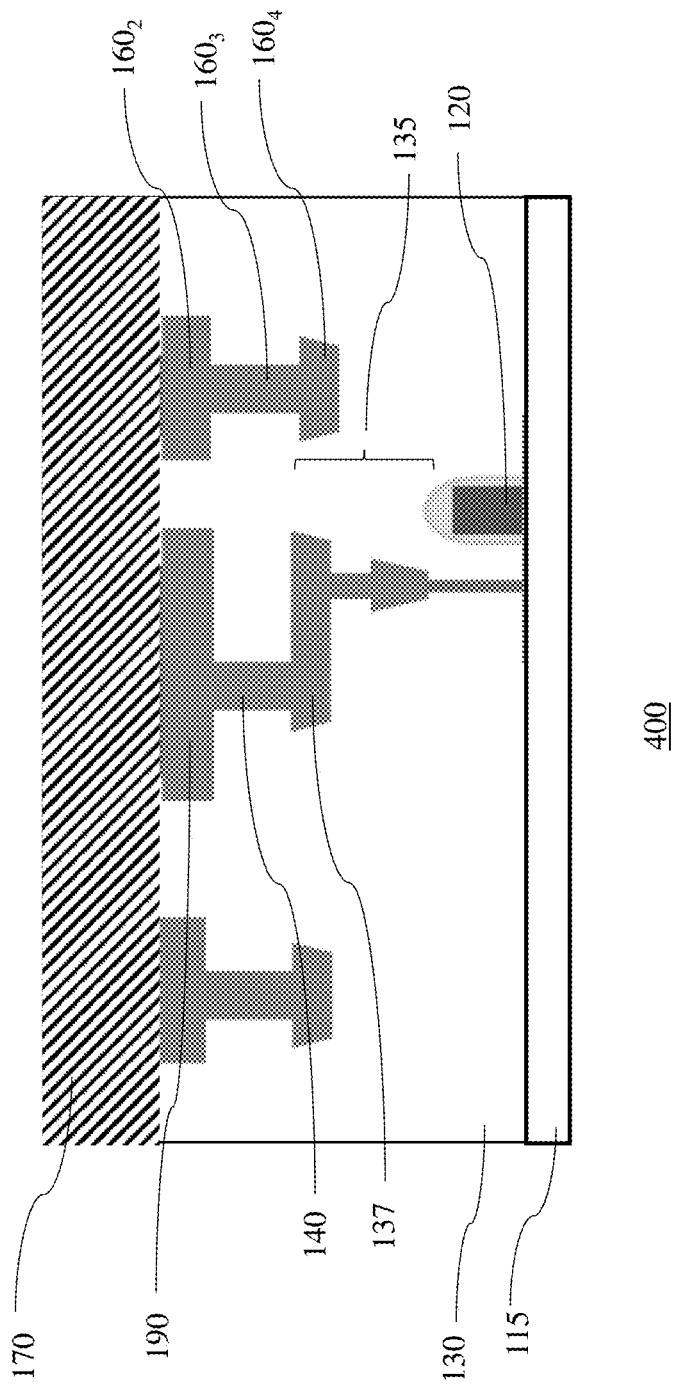
Figure 4C:
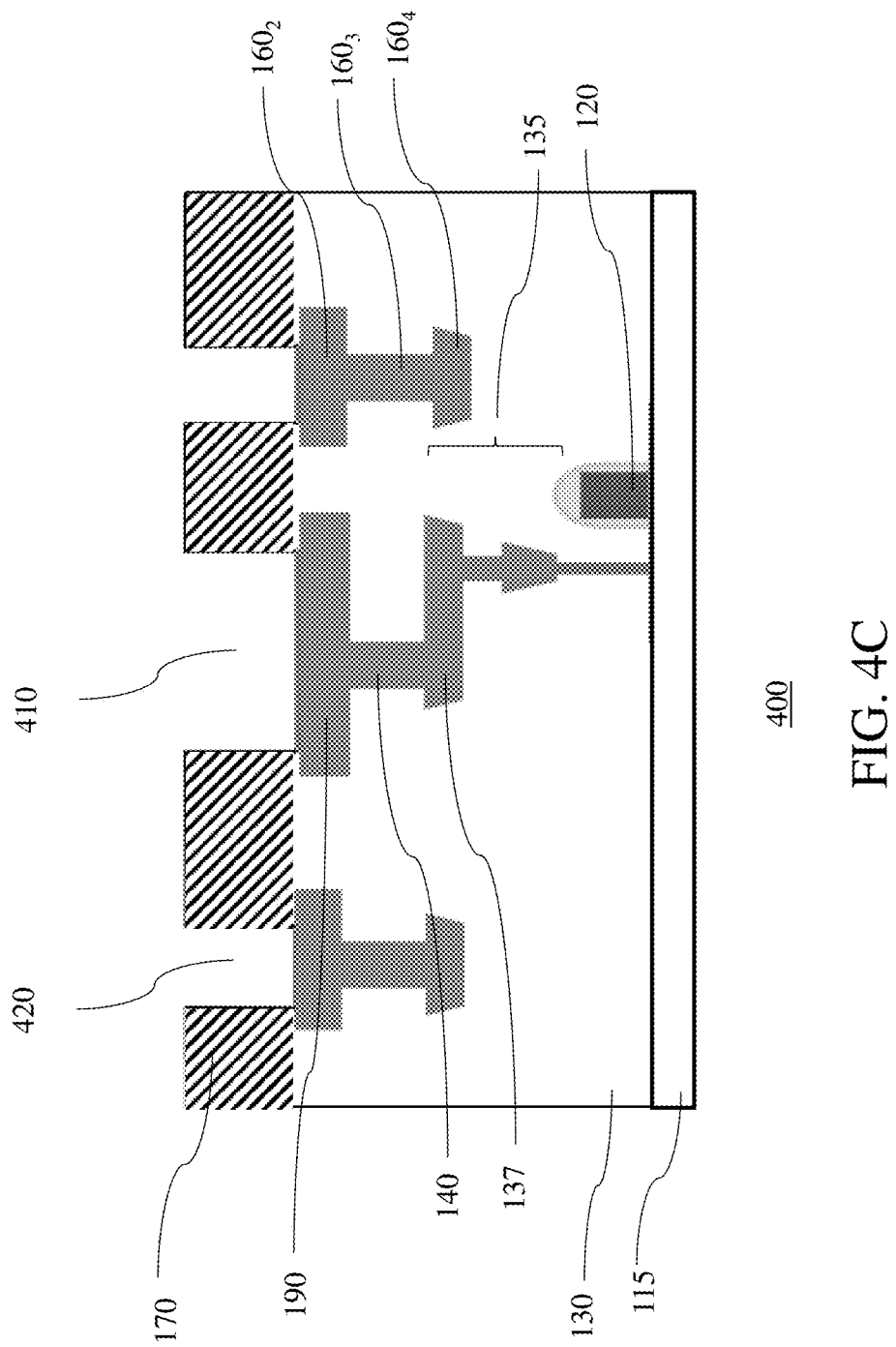

As illustrated in FIG. 4B, a passivation layer 170 may be formed over the metallization layer 130. The passivation layer 170 may be deposited, for example, by CVD. As illustrated in FIG. 4C, the passivation layer 170 may be patterned to form openings 410 and 420 corresponding to a test pad 150 and the crack stop protection seal 160 (or first portion $160_1$ of the crack stop protection seal) to be formed. For example, the passivation layer 170 may be patterned by plasma etch. A cleaning step may be performed after the plasma etch. In some embodiments, a barrier layer may be deposited over the passivation layer 170. The barrier layer lines the openings 410 and 420 in the passivation layer (not illustrated). In some embodiments, a seed layer may be deposited over the barrier layer (not illustrated). The barrier layer and the seed layer, for example, may be formed by PVD. In a non-limiting example, the barrier layer may be formed of TaN, or Ta, while the seed layer may be formed of Cu.

Figure 4D:
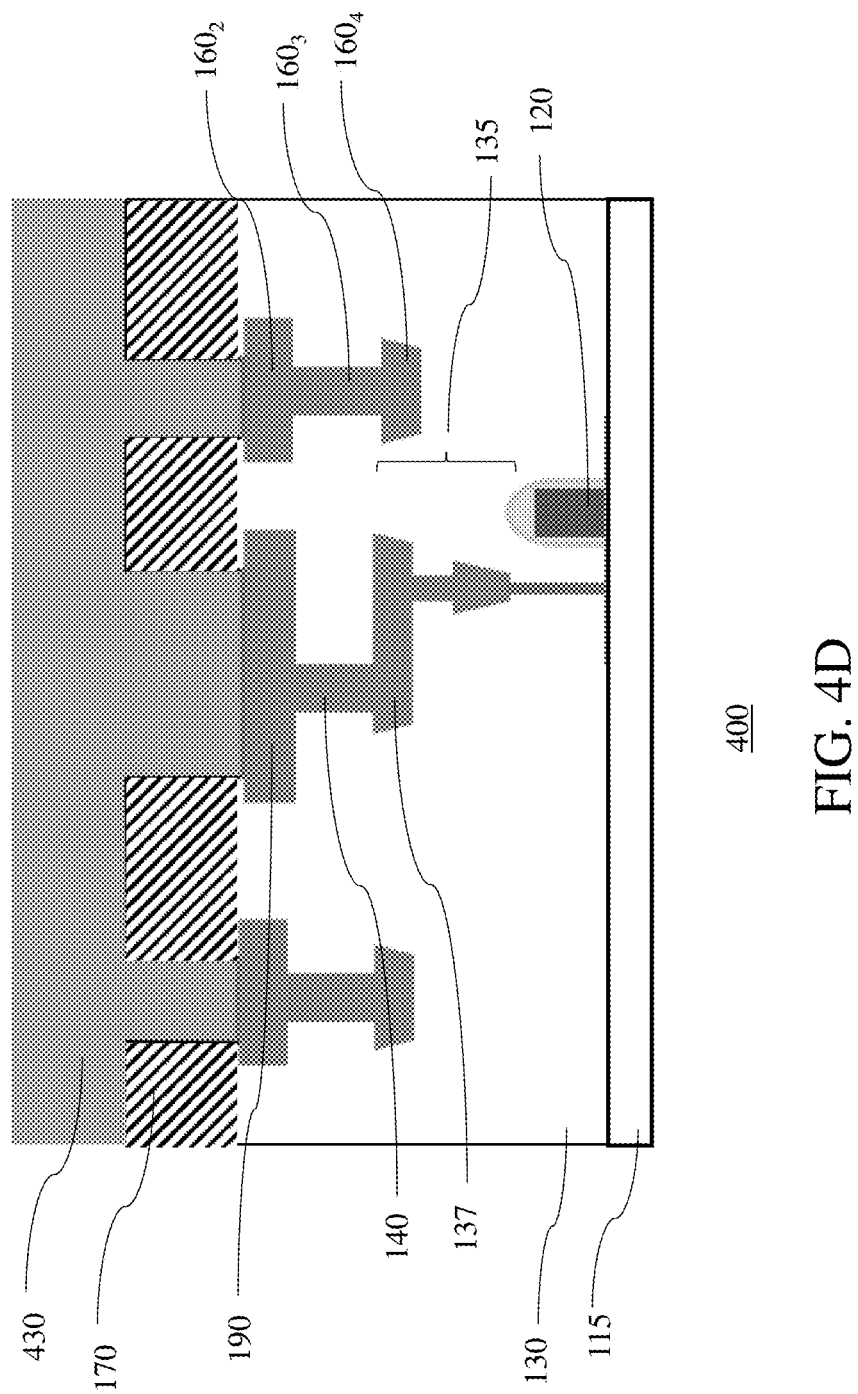

As illustrated in FIG. 4D, a metal layer 430 may be deposited over the passivation layer 170. For example, the metal layer 430 may be deposited over the barrier layer and the seed layer. The metal layer 430 may be formed by electroplating in a non-limiting example. Excess material of the metal layer 430 may be removed by polishing such as chemical mechanical polishing, in a non-limiting example.

Figure 4E:
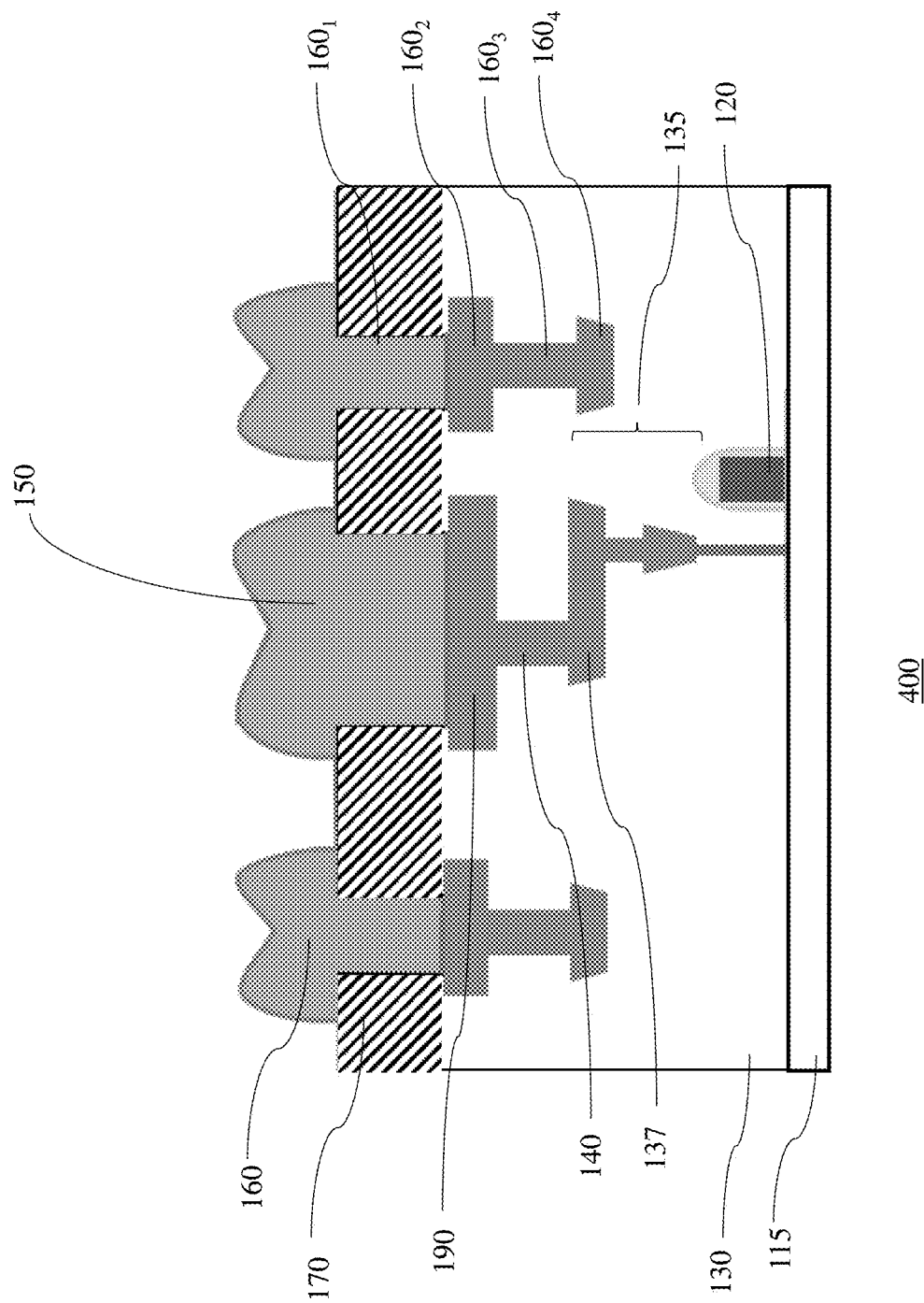

In a non-limiting example, the metal layer may be aluminium. Other suitable types of conductive materials may also be useful. In a non-limiting embodiment, the metal layer 430 may be patterned by mask and etch techniques, forming the test pad 150 and the crack stop protection seal 160 surrounding the test pad 150 as illustrated in FIG. 4E. For example, in the case the crack stop protection seal 160 includes one or more portions in the metallization layer 130, a portion of the crack stop protection seal 160 surrounding the test pad 150 above the metallization layer 130 may be referred to as the first portion $160_1$ of the crack stop protection seal 160. For example, the test pad 150 and the crack stop protection seal 160 (or first portion $160_1$ of the crack stop protection seal) may be formed simultaneously. In some cases, the test pad and the crack stop protection seal may be formed simultaneously with a plurality of bond pads in the device.

Figure 4F:
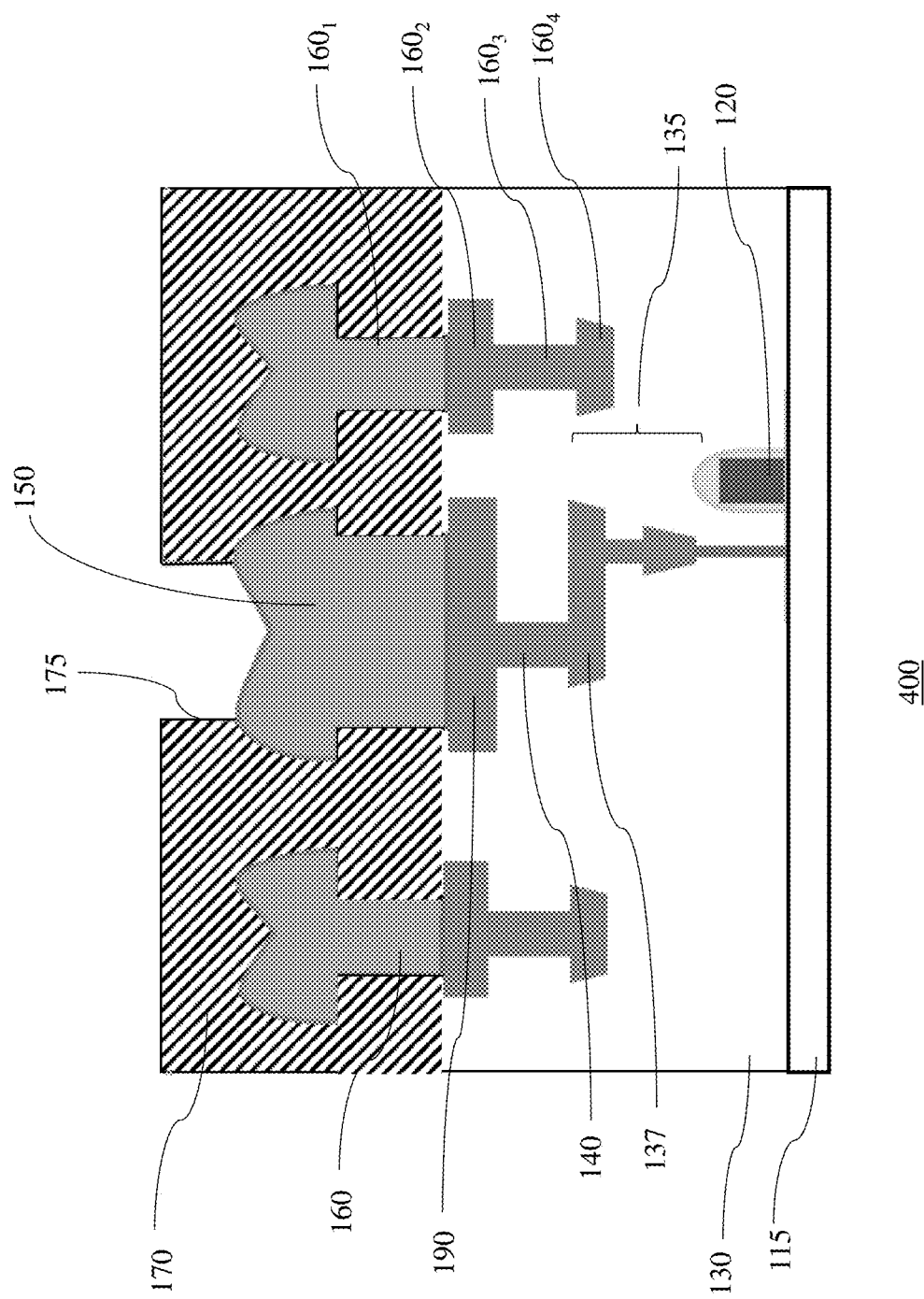

As illustrated, the test pad 150 may be formed over the metal line 190. The test pad 150 may be coupled to one or more circuit elements 120 via the interconnects 135 and the one or more via contacts 140. In a non-limiting embodiment, a dielectric layer may be deposited over the test pad 150 and the crack stop protection seal 160 to form the passivation layer 170 which covers a top surface of the test pad 150 and the crack stop protection seal 160 (or first portion $160_1$ of the crack stop protection seal). A probe opening 175 may be formed in the passivation layer 170 to at least partially expose a top surface of the test pad 150, as illustrated in FIG. 4F. The probe opening may be formed by mask and etch techniques.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having circuit elements thereon;
   a metallization layer over the substrate, the metallization layer having interconnects interconnecting the circuit elements;
   a test pad disposed over an uppermost interconnect in the metallization layer, wherein the test pad is coupled to one or more of the circuit elements via the interconnects, wherein the test pad is configured for testing the one or more of the circuit elements;
   one or more via contacts disposed between the test pad and the uppermost interconnect, wherein the one or more via contacts couple the test pad to the interconnects and the one or more of the circuit elements; and
   a crack stop protection seal surrounding the test pad; wherein the crack stop protection seal does not extend beyond a depth of the test pad and into the metallization layer having the interconnects, and wherein the crack stop protection seal confines damage caused by probing at the test pad from propagating to an area beyond the crack stop protection seal.

2. The device of claim 1, wherein the test pad and the crack stop protection seal are formed of copper.

3. The device of claim 1, further comprising a metal line disposed over the one or more via contacts, wherein the metal line and the one or more via contacts couple the test pad to the uppermost interconnect.

4. The device of claim 3, wherein the test pad and the crack stop protection seal are formed of aluminum.

5. The device of claim 1, further comprising a passivation layer disposed over the test pad and the crack stop protection seal, wherein the passivation layer comprises a probe opening to at least partially expose a top surface of the test pad, wherein the crack stop protection seal confines damage caused by probing at the test pad from propagating to the passivation layer.

6. The device of claim 1, wherein the test pad and the crack stop protection seal are formed of the same material.

7. The device of claim 1, wherein the crack stop protection seal is formed of metal.

8. The device of claim 1, wherein the crack stop protection seal is formed of a rigid material.

9. The device of claim 1, wherein the crack stop protection seal and the test pad comprise a substantially planar top surface.

10. The device of claim 1, further comprising a plurality of bond pads.

11. The device of claim 10, wherein a dimension of the test pad to a bond pad of the plurality of bond pads has a ratio ranging from about 1:10 to about 1:1000.

12. The device of claim 1, wherein each of the one or more via contacts comprises a width ranging from about 0.5 um to about 1.5 um.

13. The device of claim 1, wherein the crack stop protection seal has a same depth as the test pad.

14. The device of claim 13, wherein the crack stop protection seal has a thickness ranging from about 0.05 um to about 5 um.

15. The device of claim 1, wherein the one or more via contacts disposed between the test pad and the uppermost interconnect is a single via contact.

16. A method of forming a device, comprising:
providing a substrate having circuit elements thereon,
arranging a metallization layer over the substrate, wherein the metallization layer has interconnects interconnecting the circuit elements;
forming a test pad over an uppermost interconnect in the metallization layer, wherein the test pad is coupled to one or more of the circuit elements via the interconnects, wherein the test pad is configured for testing the one or more of the circuit elements;
forming one or more via contacts between the test pad and the uppermost interconnect, wherein the one or more via contacts couple the test pad to the interconnects and the one or more of the circuit elements; and
forming a crack stop protection seal surrounding the test pad; wherein the crack stop protection seal does not extend beyond a depth of the test pad and into the metallization layer having the interconnects, wherein the crack stop protection seal confines damage caused by probing at the test pad from propagating to an area beyond the crack stop protection seal.

17. The method of claim 16, wherein the test pad and the crack stop protection seal are formed of the same material.

18. The method of claim 16, wherein the test pad and the crack stop protection seal are formed in the same deposition step.

19. The method of claim 16, further comprising forming a passivation layer over the test pad and the crack stop protection seal, and forming a probe opening in the passivation layer to at least partially expose a top surface of the test pad, wherein the crack stop protection seal confines damage caused by probing at the test pad from propagating to the passivation layer.

20. The method of claim 16, wherein the test pad and the crack stop protection seal is formed simultaneously with a bond pad.

* * * * *